United States Patent [19]

Maserjian

[11] Patent Number: 4,954,864
[45] Date of Patent: Sep. 4, 1990

[54] MILLIMETER-WAVE MONOLITHIC DIODE-GRID FREQUENCY MULTIPLIER

[75] Inventor: Joseph Maserjian, La Crescenta, Calif.

[73] Assignee: The United States of America as represented by the Administrator of the National Aeronautics and Space Administration, Washington, D.C.

[21] Appl. No.: 283,673

[22] Filed: Dec. 13, 1988

[51] Int. Cl.$^5$ ............................................. H01L 27/14
[52] U.S. Cl. ........................................ 357/30; 357/15; 357/29; 357/32; 357/58
[58] Field of Search ................ 357/30 B, 30 C, 30 E, 357/30 G, 30 H, 30 P, 30 R, 30 Q, 29, 19, 58, 17, 32, 15

[56] References Cited

U.S. PATENT DOCUMENTS

| | | | |
|---|---|---|---|
| 3,904,449 | 9/1975 | DiLorenzo et al. | 148/175 |
| 4,045,252 | 8/1977 | Moutou | 148/1.5 |
| 4,163,677 | 8/1979 | Carlson et al. | 136/89 |
| 4,310,362 | 1/1982 | Roche et al. | 148/1.5 |
| 4,373,166 | 2/1983 | Bergeron et al. | 357/15 |
| 4,410,902 | 10/1983 | Malik | 357/58 |
| 4,622,736 | 11/1986 | Drobny | 29/571 |
| 4,641,161 | 2/1987 | Kim et al. | 357/22 |
| 4,667,211 | 5/1987 | Iafrate et al. | 357/58 |
| 4,732,873 | 3/1988 | Perbet et al. | 357/58 |

FOREIGN PATENT DOCUMENTS

| | | | |
|---|---|---|---|
| 0107278 | 8/1980 | Japan | 357/30 D |
| 0299088 | 12/1987 | Japan | 357/30 R |

OTHER PUBLICATIONS

Udo Lieneweg & John Bean, "Space-Charge Behavior of Thin-MOS Diodes with MBE-Grown Silicon Films", Solid-State Electronics, vol. 27, No. 10, pp. 867-880, 1984.

D. B. Rutledge & S. E. Schwarz, "Planar Multimode Detector Arrays for Infrared and Millimeter-Wave Applications," IEEE Journal of Quantum Electronics, vol. QE-17, No. 3, pp. 407-414, Mar. 1981.

C. Jou, et al., "Thin MOS Millimeter Wave Frequency Multipliers and Phase Shifters," 9th Conf., IR & MM Waves, Takarazuka, Osaka, Japan pp. 256-257, Oct. 1984.

Primary Examiner—Rolf Hille
Assistant Examiner—Minh Loan Tran
Attorney, Agent, or Firm—Thomas H. Jones; John R. Manning; Charles E. B. Glenn

[57] ABSTRACT

A semiconductor diode structure useful for harmonic generation of millimeter or submillimeter wave radiation from a fundamental input wave is fabricated on a GaAs substrate. A heavily doped layer of n++ GaAs is produced on the substrate and then a layer of intrinsic GaAs on said heavily doped layer on top of which a sheet of heavy doping (++) is produced. A thin layer of intrinsic GaAs grown over the sheet is capped with two metal contacts separated by a gap to produce two diodes connected back to back through the n++ layer for multiplication of frequency by an odd multiple. If only one metal contact caps the thin llayer of intrinsic GaAs, the second diode contact is produced off the diode structure and connected to the n++ layer for multiplication of frequency by an odd multiple. If only one metal contact caps the thin layer of intrinsic GaAs, the second diode contact is produced to connect to the n++ layer for multiplication of frequency by an even number. The odd or even frequency multiple is selected by a filter. A phased array of diodes in a grid will increase the power of the higher frequency generated.

13 Claims, 3 Drawing Sheets

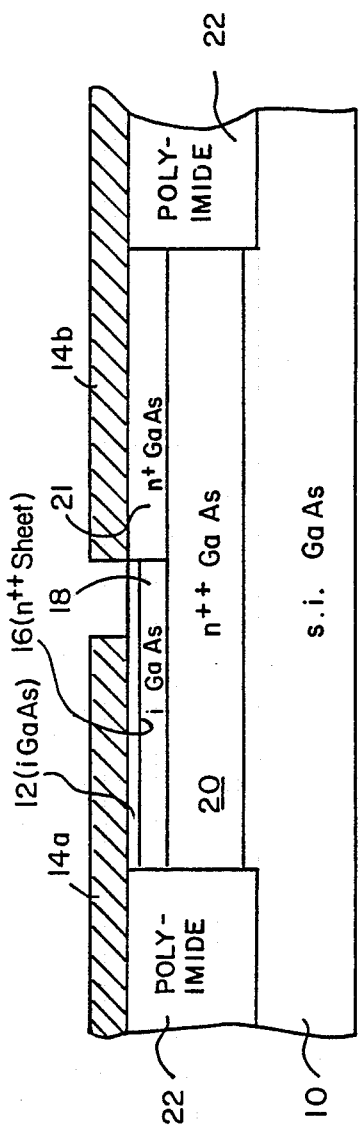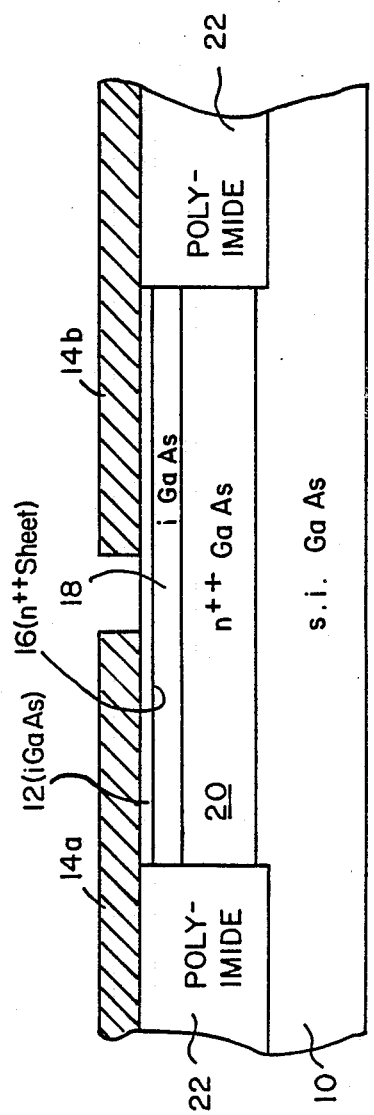

4,954,864

MILLIMETER-WAVE MONOLITHIC DIODE-GRID FREQUENCY MULTIPLIER

ORIGIN OF THE INVENTION

The invention described herein was made in the performance of work under a NASA contract, and is subject to the provisions of Public Law 96-517 (35 USC 202) in which the Contractor has elected not to retain title.

TECHNICAL FIELD

This invention relates to a millimeter-wave monolithic diode-grid frequency multiplier using barrier-intrinsic-n+ (BIN) semiconductor diodes useful for harmonic generation of mixing microwave signals at millimeter and submillimeter wavelengths in, for example, submillimeter wave spectroscopy.

BACKGROUND ART

A serious problem in the development of submillimeter wavelength receivers for atmospheric and space spectroscopy is the availability of suitable local oscillators required for heterodyne mixing. Such local oscillators must have reasonable power output and efficiency, and are required to cover a range of wavelengths of interest to spectroscopy. Lasers are being developed for this purpose, but each laser system is restricted essentially to a single wavelength. Some tunability can be achieved by optical techniques, but only over very limited bandwidths. Microwave generators such as carcinotrons do not operate efficiently at wavelengths shorter than a millimeter, and they are excessively heavy, power consuming and of short lifetime, restricting their use in flight missions. Available solid-state oscillators, such as GaAs Gunn diodes and IMPATT (impact ionization avalanche transit time) diodes are highly efficient and tunable, but are currently limited to frequencies up to about 75 and 150 GHz, respectively, for output power $\geq 0.1W$.

Much higher frequencies can be obtained by generating harmonics of the fundamental frequency from these available solid-state oscillators. Two cascaded harmonic multipliers based on whisker-coupled GaAs varactor diodes in waveguide configurations have produced 0.3 mW at 492 GHz. However, waveguide fabrication and impedance matching technologies are already at their limits at this frequency. Therefore, planar structures for quasi-optical coupling are preferred. In the planar technology, arrays of diodes can be easily fabricated and integrated with antenna structures. The total power produced is then proportional to the number of diodes provided. However, varactor diodes have serious limitations at higher frequencies. These stem primarily from the parasitic resistance introduced by the front ohmic contact. Furthermore, the weak dependence of the capacitance on the voltage C(V) limits efficiency in harmonic generation, especially for higher harmonics.

Another example of this planar array approach, which overcomes the deficiencies of the varactor diodes involves T-MOS (thin metal-oxide-silicon) diodes, which have an undoped thin epitaxial silicon layer, and exhibit an exponential dependence of the space charge capacitance on voltage, and thus produces harmonics more efficiently. This has been demonstrated with single diodes in a whisker-coupled waveguide configuration for frequency doubling and tripling. Furthermore, due to the blocking barrier, two diodes can be operated back-to-back generating a sharp spike in the C(V) curve. This arrangement, which needs no external ohmic contact, makes a highly efficient frequency tripler in which the efficiency does not degrade with high fundamental power. As a further advantage, the input and output impedances are doubled. However, defects in the epitaxial silicon layer deteriorate the thin oxide and limit the fabrication yield of the device.

Yet another planar array approach investigated involves monolithic Schottky diode grids fabricated on 2-cm square gallium-arsenide wafers. Second harmonic conversion efficiencies of 9.5% and output powers of 0.5 W were achieved at 66 GHz when the diode grid was pumped with a pulsed source at 33 GHz. However, using currently realizable diode parameters, it should be possible to achieve CW doubling efficiencies of 60% at 66 GHz with output powers of 2 W using edge cooled wafers.

STATEMENT OF THE INVENTION

A millimeter or submillimeter wave monolithic diodegrid frequency multiplier is provided on a substrate wafer of a semiconductor material having high electron mobility and saturation velocity. The structure consists of a grid of metal that functions as an antenna connected to an array of semiconductor diodes, each comprised of a heavily doped n++ layer of semiconductor material functioning as a low resistance back contact, an intrinsic layer of the semiconductor material, and a barrier between the intrinsic layer and at least one metal contact, that barrier comprising a sheet of n++ doping over the intrinsic layer and a thin barrier layer between that sheet and at least one metal contact on a planar surface of the structure. If just one of two metal contacts is deposited on the barrier layer, a single diode for frequency multiplication by an even number results, and if both of the metal contacts are deposited on the barrier layer with a gap between the metal contacts, two diodes connected back to back through the heavily doped n++ layer results for multiplication by an odd number.

The novel features that are considered characteristic of this invention are set forth with particularity in the appended claims. The invention will best be understood from the following description when read in connection with the accompanying drawings

BRIEF DESCRIPTION OF THE DRAWINGS

FIG. 2 illustrates schematically one half of a longitudinally sectioned pair of BIN diodes fabricated on a semiintrinsic GaAs substrate and connected back to back for frequency tripling.

FIG. 3 is a schematic diagram of a single BIN diode fabricated on a semi-intrinsic GaAs substrate for frequency doubling.

DETAILED DESCRIPTION OF THE INVENTION

Figure 1A:
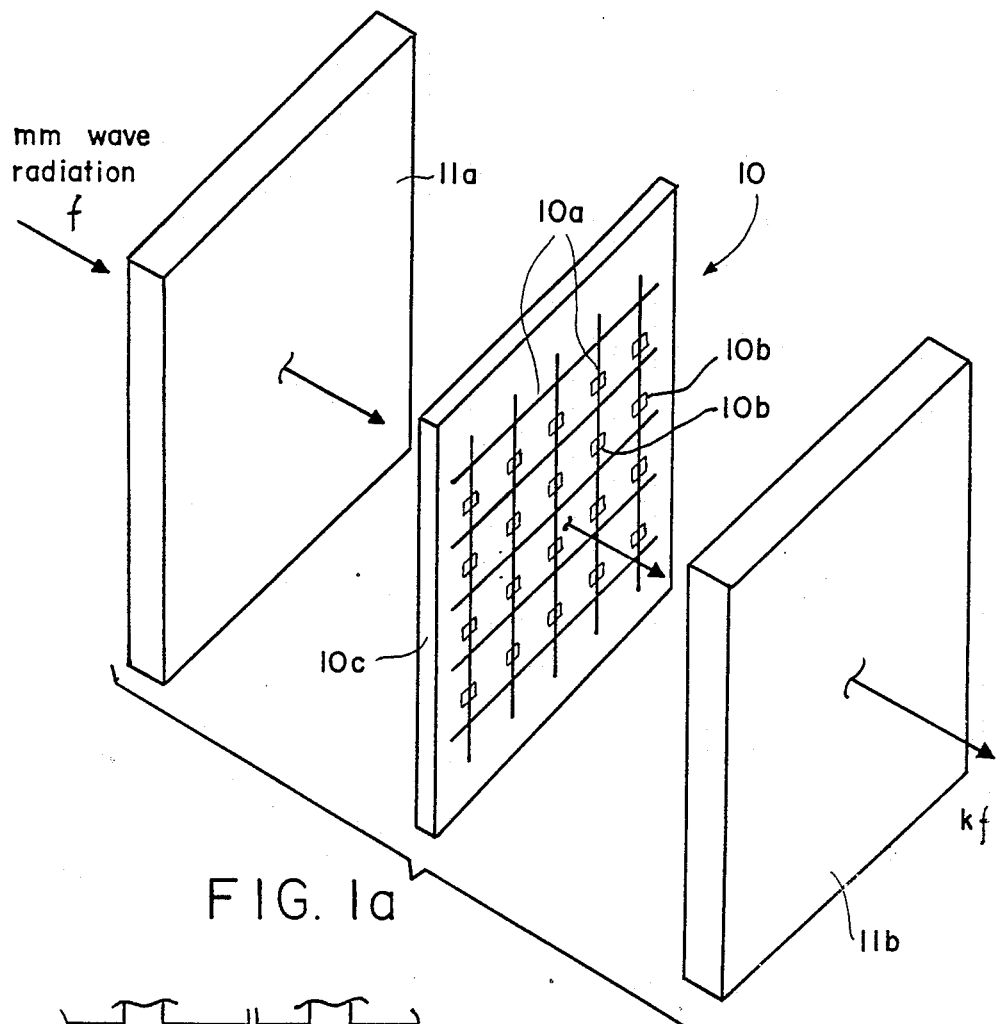
FIG. 1a illustrates schematically a submillimeter-wave frequency multiplier array of barrier-intrinsic-n+ (BIN) diodes.
Figure 1B:
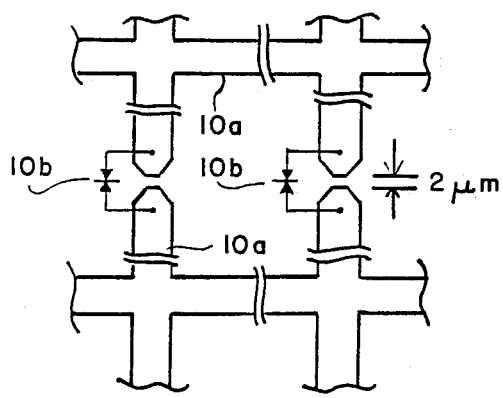
FIG. 1b illustrates in greater detail two BIN diodes shown schematically connected back to back in the structure of FIG. 3.

In order to achieve an inexpensive watt level CW solid-state source of radiation for millimeter and submillimeter wave applications, the present invention illustrated schematically in FIG. 1 provides a semiconductor BIN diode grid 10 for frequency multiplication. For simplicity of illustration, a 5×5 grid of conductors 10a is shown with BIN diodes 10b. Millimeter-wave radiation from a source, such as an IMPATT diode (not shown), is passed through a filter 11a onto the array 10 of BIN diodes 10b monolithically integrated on a gallium-arsenide wafer 10c typically 2-cm square. There radiation is multiplied by the diodes in the array to increase the input frequency from f to kf, where k may be an even integer for the case of single BIN diodes, or an odd integer for the case of two back-to-back BIN diodes. For example, in the case of back-to-back diodes, the input frequency may be tripled from about 33 GHz to about 99 GHz, with an efficiency of greater than 35% from the input to the output radiation. The output radiation is passed through a filter 11b which selects the tripled frequency from among all of the odd multiples generated.

The present invention uses selective planar doping during growth by molecular beam epitaxy (MBE) to define a BIN (barrier-intrinsic-n+) diode structure. Two possible device configurations are illustrated in FIGS. 2 and 3. FIG. 2 illustrates a back-to-back configuration of two BIN diodes which would function as an efficient frequency multiplier in which the even multiples are cancelled, and FIG. 3 illustrates a single BIN-diode which would function as a frequency multiplier which generates only even multiples. Because the two configurations are so similar, the same reference numerals are applied to both FIG. 2 and FIG. 3 to refer to the same elements in each configuration.

Referring to FIG. 2, this structure does not require an insulator layer, as in thin-MOS (T-MOS) diode structures, but instead relies on a Mott-type barrier formed by an intrinsic layer in the semiconductor structure between metal contacts 14a and 14b (which define a pair of back-to-back diodes) and an n++ sheet 16 of positive charge formed by a doping (n++). It should be understood that the barrier may also be formed in other ways, such as by an insulating oxide layer or by a semiconductor material with wider bandgap, e.g., by heteroepitaxy.

The active region for nonlinear response and multiplication of input radiation is an intrinsic layer 18 between the barrier layer 12 and a heavily doped n++ layer 20. Accumulation and depletion of electrons at the barrier layer 12 by space-charge-limited current produce nonlinearities in the capacitance-voltage characteristic which are much stronger than in a varactor diode, especially at low temperatures. Also in each BIN diode the RC product is minimized for maximum cutoff frequency. The device structure can be readily grown by molecular beam epitaxy MBE with semiconductor materials having high mobility and saturation velocity, such as GaAs (or even more so InAs), further extending the cut-off frequency.

The maximum cut-off frequency is determined by the time it takes electrons to transit the space charge layer 20 at saturation velocity. For a 100-nm n++ GaAs layer, the cut-off frequency $f_c \approx 1$ THz. An efficiency of $\sim 1\%$ is calculated for $f_{out}=f_c$. The efficiency for $f_{out}=0.3\ f_c$ is $\sim 10\%$. A combined efficiency of 0.1% is projected for $f_{out}=1$ THz for two back-to-back diodes shown in FIG. 2. Hence, 100 mW input power is required for the projected minimum output power of 100 $\mu$W, a goal presently achievable using an IMPATT diode as a source. The planar growth process (e.g., MBE) also lends itself to fabrication of other integrated circuitry on the same wafer by standard photolithographic techniques, such as integration with optimized coupling structures for quasi-optical coupling of submillimeter wave radiation. An output power of 1 mW can be achieved with very small arrays of $\sim 10$ diodes. Larger arrays of $\sim 100$ diodes can be accommodated on commonly sized chips for higher output power; however, a larger BIN diode array requires a proportionally stronger source, e.g., a phase-locked array of IMPATT diodes.

FIG. 3 illustrates a single BIN diode fabricated in place of a pair of back-to-back diodes. By comparing FIGS. 2 and 3, it may be readily appreciated that the only difference in the structures is that the barrier layer 12, intrinsic layer 18 and n++ sheet 16 are terminated in the gap at or before the point where the second metal contact 14b begins. In place of the layer 18 and barrier 12, and the n++ sheet 16 therebetween, a layer 21 is provided to even the planar surface for the contact 14b and provide a low resistance connection of the metal contact 14b to the heavily doped n++ layer 20. This may be provided by MBE growth of the layer 21 heavily doped n++, or by deposition of an alloy (such as Au, Ge, Ni). Yet another technique that may be employed is implanting charges in the layer of intrinsic GaAs not etched before depositing the metal gate 14b.

Figure 4:
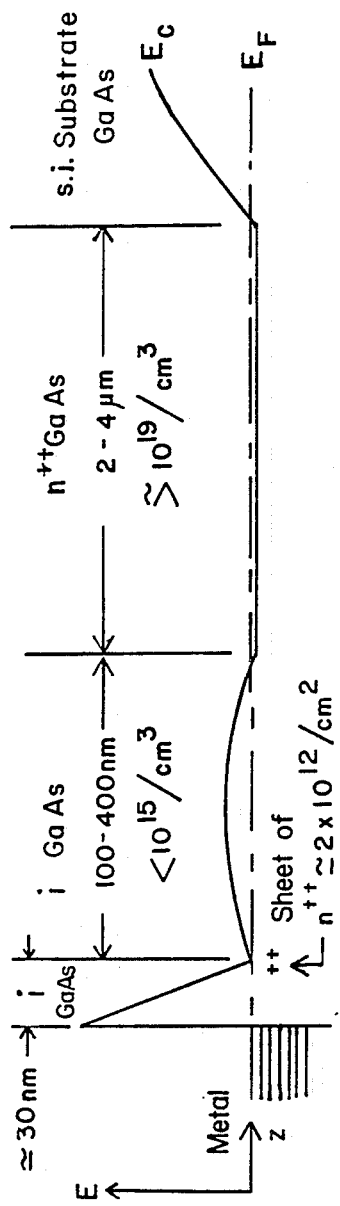
FIG. 4 is a diagram of the energy and doping profile of the BIN diode shown in FIG. 3.

FIG. 4 illustrates the doping profile and energy (conduction band edge) versus position z (growth direction) for fabrication of a single BIN diode on a GaAs substrate. The doping profile can be achieved entirely during epitaxial growth starting with a semi-insulating (s.i.) GaAs substrate. The 2.4 $\mu$m $n^{30}$ + layer 20 provides the back contact between back-to-back diodes and between a single diode and contact 14b. The 100–400 nm intrinsic (i) or undoped layer 18 provides the space-charge-limited active region, and the n++ sheet 16 of dopant ($\cong 2 \times 10^{12} cm^{-2}$) terminates the Mott barrier formed between the intrinsic layer 18 and the metal (Al) contact 14. The n++ sheet 16 should be as thin as possible (e.g., < 2 nm) for optimum performance. The thickness of the barrier layer 12 is about 30 nm.

Figure 5:
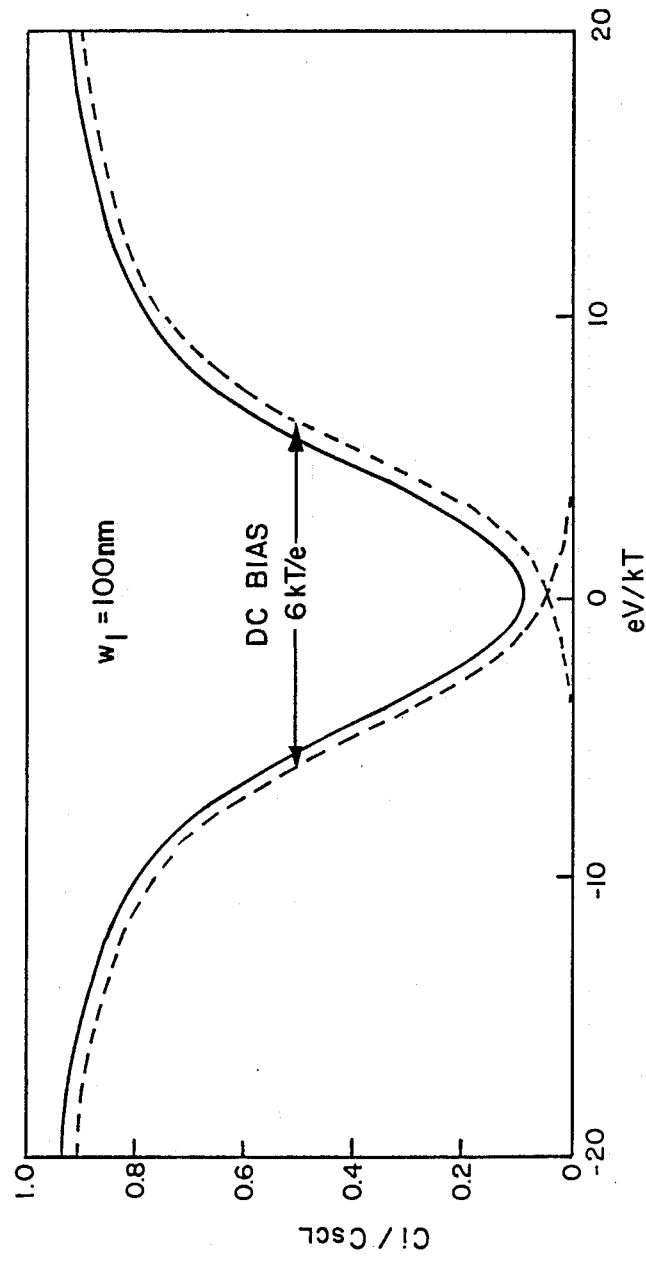
FIG. 5 is a graph illustrating the inverse capacitance dependence of a single BIN diode, and of two back-to-back BIN diodes.

The graph of FIG. 5 shows the inverse capacitance dependence of each single BIN diode (dashed curves) of the two back-to-back BIN diodes and their combined series effect (solid curve) due to the space-charge-limited capacitance $C_{SCL}$ of the intrinsic layer 18. (The capacitance of the barrier layer 12 is large and its inverse value is subtracted out for convenience.) $C_i$ is the assympotic value of $C_{SCL}$ for strong reverse bias and is equal to the geometric capacitance of the intrinsic layer 18 ($\epsilon A/w_i$). These curves were calculated from the relations derived by D.P. Howson, et al., Solid State Electronics, 8, 9 3 (1965).

The total inverse capacitance (of the back-to-back diodes) shown as the solid curve assumes a bias of 6kT/e. The height and width of this curve can be adjusted with a dc bias (applied to the n++ region, layer 20) for optimum performance. The curve shown is considered near optimum. However, this optimum condition can be achieved much more conveniently by doping control alone of the n++ sheet 16 creating the desired offset voltage (flat band voltage) and thus eliminating the need for an external dc bias. The narrow width of the C-V dependence (e.g., 6kT/e) provides for efficient multiplication even at low input power and efficient high order multiplication (e.g., 5, 7, 9 . . . at high input power. With planar doping techniques the resistivity of the n++ back contact (layer 20) can be pushed into the $10^{19}/cm^3$ region. The parasitic RC product then becomes an order of magnitude smaller than the transit time. A tradeoff between the maximum cut-off frequency and the maximum change of capacitance for efficient multiplication is thereby achieved by simply adjusting the thickness of the intrinsic layer 18.

In each device configuration shown in FIGS. 2 and 3, a mesa structure is etched out (by ion beam or chemical etching) to define the active area of one element (BIN diode or backto-back BIN diodes) of an array. The etched regions 22 may be filled with polyimide to provide a planar surface for subsequent Al metallization of the contacts 14a and 14b (FIGS. 2 and 3). These metal contacts may be extended to interconnect an array of BIN diodes in a pattern for quasi-optical coupling to radiation as shown in FIG. 1. An alternate technique to etching and filling with polyimide would be to proton bombard the area around the BIN diodes to convert it to semi-insulating GaAs. This technique is easier to apply, but may cause some degradation of the device (e.g., lower breakdown voltage).

Although particular embodiments of the invention have been described and illustrated herein, it is recognized that modifications and variations may readily occur to those skilled in the art, particularly in the manner in which the Mott-type barrier is provided. However, the embodiments illustrated have particular advantages, namely the use of uniform material with just selective dopied, and the ability to tailor flat band voltage for optimum performance. Consequently, it is intended that the claims be interpreted to cover such modifications and variations.

What is claimed is:

1. A semiconductor diode structure useful for harmonic generation of millimeter or submillimeter wave radiation from a fundamental input wave comprising
    a substrate,
    a n++ doped layer of semiconductor material on said substrate,
    a layer of intrinsic semiconductor material on said n++ doped layer,
    a sheet of positive charge firmed by surface n++ doping said intrinsic layer on the surface thereof opposite said n++ doped layer, and,
    a Mott-type barrier formed over said sheet of n++ doping by a layer of material electrically insulating said sheet from at least one of a pair of surface metal contacts, at least one of said surface contacts being deposited over said layer of electrically insulating material with a gap between said surface contacts.

2. A semiconductor diode structure as defined in claim 1 wherein only one of said surface metal contacts is deposited over said layer of insulating material and the other is not, and means for making an electrical connection of said other metal contact to said n++ doped layer of semiconductor material.

3. A semiconductor diode structure as defined in claim 1 wherein both of said metal contacts are deposited over said layer of insulating material, one over each half of said layer of insulating material.

4. A semiconductor diode structure as defined in claim 1 wherein said layer of insulating material is selected from intrinsic semiconductor material, an oxide of semiconductor material or a different semiconductor material with a wider band-gap than said semiconductor material.

5. A semiconductor diode structure as defined in claim 4 wherein said substrate is GaAs and said n++ doped layer of semiconductor material is GaAs.

6. A semiconductor diode as defined in claim 5 wherein said layer of insulating material is intrinsic GaAs.

7. A semiconductor diode as defined in claim 6 wherein said pair of surface metal contacts are electrically connected to conductors functioning as an antenna.

8. A millimeter or submillimeter wave monolithic diode-grid frequency multiplier comprising a substrate of semiconductor material, a grid of metal that functions as an antenna, and a phased array of diodes connected to said grid of metal for receiving radiation at one frequency and producing radiation through said antenna at a higher frequency that is a multiple of the radiation frequency received, each diode comprising
    a n++ doped layer of semiconductor material on said substrate,
    a layer of intrinsic semiconductor material on said n++ doped layer,
    a sheet of positive charge formed by surface n++ doping said intrinsic layer on the surface thereof opposite said n++ doped layer,
    a Mott-type barrier formed over said sheet of n++ doping by a layer of material electrically insulating said sheet from at least one of a pair of surface metal contacts, said surface metal contacts being deposited with a gap therebetween, and said surface metal contacts connecting said diode in series in a unique branch of said grid not shared by other diodes, with at least one metal contact of each diode over its layer of insulating material, and
    means for isolating each diode structure from all other diode structures on said substrate with only said grid interconnecting said phase array of diodes.

9. A monolithic diode-grid frequency multiplier as defined in claim 8 wherein only one of said surface metal contacts of each diode is over said layer of insulating material and the other is not, and means for low-resistance connection of said other surface metal contact of each diode to said n++ doped layer of semiconductor material in its isolated structure.

10. A monolithic diode-grid frequency multiplier as defined in claim 8 wherein both of said metal contacts of each diode are over said layer of insulating material, one over each half of said barrier with a gap between said one and said other contact.

11. A monolithic diode-grid frequency multiplier as defined in claim 10 wherein said layer of insulating material is selected from intrinsic semiconductor material, an oxide of semiconductor material or a different semiconductor material with a wider bandgap than said semiconductor material.

12. A monolithic diode-grid frequency multiplier as defined in claim 11 wherein said substrate is GaAs and said heavily doped layer of semiconductor material is n++ GaAs.

13. A monolithic diode-grid frequency multiplier as defined in claim 12 wherein said thin layer of material electrically insulating said sheet of n++ doping from said metal contact is intrinsic GaAs.

* * * * *